United States Patent
Janssen

(10) Patent No.: US 11,835,337 B2
(45) Date of Patent: Dec. 5, 2023

(54) INTERFEROMETRY ASSEMBLY HAVING OPTICAL PATHS THROUGH DIFFERENT MATERIALS

(71) Applicant: Lumentum Technology UK Limited, Northamptonshire (GB)

(72) Inventor: Adrian Perrin Janssen, Exeter (GB)

(73) Assignee: Lumentum Technology UK Limited, Northamptonshire (GB)

( * ) Notice: Subject to any disclaimer, the term of this patent is extended or adjusted under 35 U.S.C. 154(b) by 0 days.

(21) Appl. No.: 17/646,080

(22) Filed: Dec. 27, 2021

(65) Prior Publication Data

US 2022/0120554 A1    Apr. 21, 2022

Related U.S. Application Data

(60) Continuation of application No. 16/839,488, filed on Apr. 3, 2020, now Pat. No. 11,215,440, which is a (Continued)

(30) Foreign Application Priority Data

Jun. 28, 2016 (GB) .................................... 1611194

(51) Int. Cl.
*G01B 9/02* (2022.01)
*G01B 9/02056* (2022.01)
(Continued)

(52) U.S. Cl.
CPC ..... *G01B 9/02051* (2013.01); *G01B 9/02058* (2013.01); *G01J 3/453* (2013.01);
(Continued)

(58) Field of Classification Search
CPC .. G01B 9/02058; G01B 9/02; G01B 9/02051; G01B 9/02049; G01J 3/453;
(Continued)

(56) References Cited

U.S. PATENT DOCUMENTS

| 4,172,663 A | 10/1979 | Byer et al. |
| 4,758,060 A | 7/1988 | Jaeger et al. |

(Continued)

FOREIGN PATENT DOCUMENTS

| CN | 1227631 A | 9/1999 |
| CN | 103063129 A | 4/2013 |

(Continued)

OTHER PUBLICATIONS

Garcia-Torales, G., et al., "Simulations and Experimental Results With a Vectorial Shearing Interferometer," Optical Engineering, May 2001, vol. 40 (5), pp. 767-773, XP055501992.

(Continued)

*Primary Examiner* — Michael P LaPage
(74) *Attorney, Agent, or Firm* — Harrity & Harrity, LLP

(57) ABSTRACT

There is described an interferometer for use in an optical locker. The interferometer comprises at least two transparent materials having different thermal path length sensitivities. The interferometer is configured such that an input beam is split by the interferometer into first and second intermediate beams, which recombine to form an output beam, the first and second intermediate beams travelling along respective first and second intermediate beam paths which do not overlap. At least one of the intermediate beam paths passes through at least two of the transparent materials. A length of each intermediate beam path which passes through each transparent material is selected such that an optical path difference between the first and second intermediate beam path is substantially independent of temperature.

20 Claims, 11 Drawing Sheets

Related U.S. Application Data division of application No. 16/308,545, filed as application No. PCT/GB2017/051856 on Jun. 26, 2017, now Pat. No. 10,612,906.

(51) Int. Cl.
*H04B 10/572* (2013.01)
*G01J 3/453* (2006.01)
*H01S 5/0687* (2006.01)

(52) U.S. Cl.
CPC ............ *H04B 10/572* (2013.01); *G01B 9/02* (2013.01); *H01S 5/0687* (2013.01)

(58) Field of Classification Search
CPC .... G01J 9/0246; H04B 10/572; H01S 5/0687; G02B 6/12011; G02B 6/1203; G02B 6/122; G02B 6/125
See application file for complete search history.

(56) References Cited

U.S. PATENT DOCUMENTS

| | | | |
|---|---|---|---|
| 5,040,896 A | 8/1991 | Moslehi | |
| 5,798,859 A | 8/1998 | Colbourne et al. | |
| 6,137,636 A * | 10/2000 | Smith | G02B 23/14 359/633 |
| 6,178,002 B1 | 1/2001 | Mueller-Wirts | |
| 6,249,350 B1 | 6/2001 | Dultz et al. | |
| 6,313,918 B1 * | 11/2001 | Hill | G03F 7/70716 356/498 |
| 6,526,079 B1 | 2/2003 | Watterson et al. | |
| 6,549,548 B2 * | 4/2003 | Kuznetsov | H01S 5/0687 372/98 |
| 6,577,398 B1 | 6/2003 | Ducellier | |
| 6,621,580 B2 | 9/2003 | Myatt et al. | |
| 6,639,922 B2 | 10/2003 | Vakhshoori et al. | |
| 6,694,066 B2 | 2/2004 | Xie et al. | |
| 6,757,066 B2 * | 6/2004 | Hill | G03F 7/70775 356/498 |
| 6,782,017 B1 | 8/2004 | Kai et al. | |
| 6,804,063 B2 * | 10/2004 | Thompson | G02B 27/144 359/638 |
| 6,805,496 B2 | 10/2004 | Furuichi et al. | |
| 6,943,889 B2 | 9/2005 | Modavis | |
| 7,133,136 B2 | 11/2006 | Soskind | |
| 7,952,724 B2 | 5/2011 | De Lega et al. | |
| 8,004,750 B1 * | 8/2011 | Hsieh | H04B 10/677 359/578 |
| 9,062,957 B2 | 6/2015 | Yamada | |
| 10,612,906 B2 | 4/2020 | Janssen | |
| 11,215,440 B2 | 1/2022 | Janssen | |
| 2002/0080367 A1 | 6/2002 | Asami | |
| 2002/0154314 A1 | 10/2002 | Copner et al. | |
| 2003/0035120 A1 | 2/2003 | Myatt et al. | |
| 2003/0076502 A1 | 4/2003 | Verma et al. | |
| 2003/0107746 A1 | 6/2003 | Hedin et al. | |
| 2003/0231390 A1 | 12/2003 | Wein et al. | |
| 2004/0004722 A1 | 1/2004 | Carlson | |
| 2004/0109166 A1 | 6/2004 | Tsai et al. | |
| 2004/0120635 A1 | 6/2004 | Juan et al. | |
| 2004/0228375 A1 | 11/2004 | Ghosh et al. | |
| 2004/0246582 A1 * | 12/2004 | Du | H04Q 11/0005 359/489.19 |
| 2005/0041290 A1 * | 2/2005 | Du | G02B 6/272 359/489.17 |
| 2006/0007447 A1 | 1/2006 | Snyder et al. | |
| 2010/0177795 A1 | 7/2010 | Kim et al. | |
| 2011/0032529 A1 | 2/2011 | Wan et al. | |
| 2013/0173505 A1 | 7/2013 | Balogun et al. | |
| 2014/0139846 A1 * | 5/2014 | Jensen | G01B 9/02049 356/498 |
| 2014/0192365 A1 | 7/2014 | Mortada et al. | |
| 2014/0212092 A1 | 7/2014 | Roth et al. | |
| 2014/0328359 A1 | 11/2014 | Yano | |
| 2017/0302051 A1 | 10/2017 | Xiong et al. | |
| 2018/0102627 A1 | 4/2018 | Parker et al. | |

FOREIGN PATENT DOCUMENTS

| | | | | |
|---|---|---|---|---|
| CN | 104733995 A | 6/2015 | | |
| CN | 105493359 A | 4/2016 | | |
| CN | 105514781 A | 4/2016 | | |
| DE | 10321886 A1 * | 12/2004 | ........... | G01B 11/303 |
| EP | 0281385 A2 | 9/1988 | | |
| EP | 1156563 A2 | 11/2001 | | |
| EP | 1426746 A1 | 6/2004 | | |
| GB | 1244337 A | 8/1971 | | |
| JP | S57173704 A | 10/1982 | | |
| JP | 2000223761 A | 8/2000 | | |
| JP | 2003124559 A | 4/2003 | | |
| JP | 2003202506 A | 7/2003 | | |
| TW | 200632306 A | 9/2006 | | |
| WO | 0111739 A1 | 2/2001 | | |
| WO | 0143244 A2 | 6/2001 | | |
| WO | 02059550 A2 | 8/2002 | | |
| WO | 03100483 A2 | 12/2003 | | |
| WO | 2015030896 A1 | 3/2015 | | |

OTHER PUBLICATIONS

International Search Report and Written Opinion for Application No. PCT/GB2017/051856, dated Dec. 5, 2017, 18 pages.

Speake C.C., et al., "An Interferometric Sensor for Satellite Drag-Free Control," Classical and Quantum Gravity, Institute of Physic Publishing, May 2005, vol. 22 (10), pp. S269-S277.

United Kingdom Search and Examination Report for Application No. GB1611194.0, dated Jan. 10, 2019, 6 pages.

United Kingdom Search Report for Application No. GB1611194.0, dated Oct. 24, 2016, 6 Pages.

Written Opinion of the International Preliminary Examining Authority for Application No. PCT/GB2017/051856, dated Aug. 31, 2018, 8 pages.

Hao et al., "An Ultrastable Wavelength Calibration Reference Constructed From an Athermal Mach-Zehnder Interferometer Filter," Optical Fiber Communication and the National Fiber Optic Engineers Conference, Electronics Letters, Nov. 2006, vol. 42(24), pp. 1.

* cited by examiner

INTERFEROMETRY ASSEMBLY HAVING OPTICAL PATHS THROUGH DIFFERENT MATERIALS

RELATED APPLICATIONS

This application is a continuation of U.S. patent application Ser. No. 16/839,488, filed on Apr. 3, 2020 (now U.S. Pat. No. 11,215,440), which is a divisional of U.S. patent application Ser. No. 16/308,545, filed on Dec. 10, 2018 (now U.S. Pat. No. 10,612,906), which is a 35 U.S.C. 371 national stage filing of International Application No. PCT/GB2017/051856, filed on Jun. 26, 2017, which claims priority from United Kingdom Application No. GB1611194.0 filed on Jun. 28, 2016. The contents of the aforementioned applications are hereby incorporated by reference in their entireties.

FIELD OF THE INVENTION

The present invention relates to an optical locker. In particular, the invention relates to improvements to an interferometer for measuring wavelength in an optical locker.

BACKGROUND

In fibre-optic communications channels, Dense Wavelength Division Multiplexing (DWDM) is used to transmit multiple optical signals via a single fibre. For such applications, each of the channels has a distinct frequency, defined by a frequency grid (e.g. ITU-T G.694.1).

The frequencies of optical signals produced by laser sources are "locked" to the frequencies of the grid by a wavelength locking mechanism. The wavelength locking mechanism comprises a means for measuring the wavelength of each optical signal, and a feedback loop which adjusts the output of the corresponding laser source in dependence upon the measurement.

Typically, the means for measuring the wavelength comprises a Fabry-Perot (FP) etalon (or interferometer). An FP etalon is illustrated in FIG. 1A, and comprises a transparent plate with two reflecting surfaces. As the light bounces between the surfaces, the transmitted rays interfere with each other, producing a characteristic interference pattern, which is dependent upon the frequency and the optical distance between the plates.

The frequency response of a FP etalon has the characteristic curve shown in FIG. 1B. To provide the greatest resolution for the optical locker, it is calibrated such that the desired frequency is in a region of the frequency response graph with a high gradient. This means that small changes in the frequency will produce large changes in the output.

Since the behaviour of an etalon is dependent on the optical path length through the plate, the behaviour is strongly temperature dependent. The optical path will tend to increase with temperature, both due to the expansion of the material with temperature, and the change in refractive index of the material with temperature.

$$P(T) = n(T)L(T)$$

$$\alpha = \frac{1}{L}\frac{dL}{T}$$

$$\psi = \frac{dN}{dT}$$

Where P is the optical path length, n(T) is the refractive index as a function of temperature, L(T) is the physical length as a function of temperature, α is the coefficient of thermal expansion, and ψ is the thermo-optic coefficient. α is positive for most materials, and ψ may be positive or negative.

Therefore, to ensure proper calibration, the temperature of an etalon must be strictly controlled. This can either be done by keeping the etalon at a constant temperature. In more sophisticated etalons such as that disclosed in WO 2015/030896, the temperature of the etalon can be varied in a controlled manner in order to allow the etalon to be automatically recalibrated to different frequencies.

The temperature control adds additional complexity and cost to the manufacture of the etalon, and so there is a need for an optical locker which can be made temperature independent.

In order to create a temperature independent etalon (to form the basis of a temperature independent optical locker), the phase difference between interfering beams must be independent of temperature. In order to achieve this, the optical path difference between the beams must be independent of temperature.

Consider a simplified FP etalon, where there are only two transmitted beams—a beam which passes straight through the transparent plate, and a beam which is reflected once off each interfering surface. $P_1$ is the optical path length of the first beam, $P_2$ is the optical path length of the second beam, and $\Delta P$ is the optical path difference.

$$\Delta P = P2 - P1 = \left(\frac{2\pi}{\lambda}\right)2nl\cos\varphi$$

as can be found in any textbook discussion of the FP etalon, e.g. wikipedia.org/wiki/Fabry-Perot_interferometer.

$\Delta P$ contains a contribution from the difference in path length within the transparent plate, and a contribution from the difference of path length in air. The difference of path length in air is essentially constant over reasonable temperatures, so the temperature dependence comes from the difference in path length through the transparent material. $p_1$ is the optical path length of the first beam through the transparent material, and $p_2$ is the optical path length of the second beam through the transparent material. Since the first and second path pass through the same material, $p_2=3p_1$, so $\Delta P = \Delta P_{air}+2p_1$. Therefore the temperature dependence of the path difference, $d\Delta P/dT=2dp_1/dT$, the temperature dependence of the path through the transparent material.

$dp_1/dT$ cannot be zero for any known material. For known materials, the change in path length with temperature, dP/dT, is generally positive, as even in those materials with a negative thermo-optic coefficient, the expansion of the material itself (i.e. increase in L) counteracts the reduction in refractive index. FIG. 2 shows this—FIG. 2A shows α vs ψ for a range of glasses, and FIG. 2B shows the overall thermal path dependence for a range of glasses. Since dP/dT is positive, no combination of materials in the transparent plate can result in $dp_1/dT$ being zero.

Therefore, a temperature independent etalon is not possible.

SUMMARY

According to one aspect of the present invention there is provided an interferometer for use in an optical locker. The interferometer comprises at least two transparent materials having different thermal path length sensitivities. The interferometer is configured such that an input beam is split by the interferometer into first and second intermediate beams, which recombine to form an output beam, the first and second intermediate beams travelling along respective first and second intermediate beam paths which do not overlap. At least one of the intermediate beam paths passes through at least two of the transparent materials. A length of each intermediate beam path which passes through each transparent material is selected such that an optical path difference between the first and second intermediate beam path is substantially independent of temperature.

According to a further aspect, there is provided a Michelson interferometer for use in an optical locker. The interferometer comprises a beam splitter, first and second mirrors, and at least two transparent materials. The beam splitter is configured to split an input beam into first and second intermediate beams, and to recombine said intermediate beams to form an output beam, the first and second intermediate beams travelling along respective first and second intermediate beam paths. The first and second mirrors are respectively positioned intersecting said first and second intermediate beam paths such that the first and second beam paths are reflected back to the beam splitter by the first and second mirrors, and wherein the first and second mirrors are positioned so as to create an optical path difference between the first and second beam paths. The at least two transparent materials have different thermal path length sensitivities. A length of each intermediate beam path which passes through each transparent material is selected such that the optical path difference between the first and second intermediate beam path is substantially independent of temperature.

According to a further aspect, there is provided a Mach-Zehnder interferometer for use in an optical locker. The interferometer comprises first and second beam splitters, at least one mirror, and at least two transparent materials. The first beam splitter is configured to split an input beam into first and second intermediate beams, the first and second intermediate beams travelling along respective first and second intermediate beam paths. The second beam splitter is configured to recombine said intermediate beams to form an output beam. The at least one mirror is positioned intersecting said first and/or second intermediate beam paths such that the first and second beam paths travel from the first beam splitter to the second beam splitter, and wherein the at least one mirror is positioned so as to create an optical path difference between the first and second beam paths. The at least two transparent materials have different thermal path length sensitivities. A length of each intermediate beam path which passes through each transparent material is selected such that the optical path difference between the first and second intermediate beam path is substantially independent of temperature.

According to a further aspect, there is provided an interferometry assembly for use in an optical locker. The assembly comprises an input assembly, an interferometer, and a detector assembly. The input assembly is configured to receive a test beam, to split the test beam into a plurality of physically non-coincident input beams, and to direct the input beams to the interferometer. The interferometer is configured to receive each input beam and to produce, for each input beam, an output beam with an intensity that depends on the wavelength of the input beam. The detector assembly is configured to produce a plurality of output signals, each output signal being dependent on the intensity of a respective output beam. The input assembly is configured to direct the input beams such that each input beam travels through the interferometer with a differing path difference, and such that the output beams arrive at the detector assembly physically separated.

According to a further aspect, there is provided an interferometry assembly for use in an optical locker. The assembly comprises an interferometer, and a detector assembly. The interferometer is configured such that an image of the input viewed from the output along a first path is displaced from an image of the input viewed from the output along a second path at least in a direction perpendicular to the input beam. The detector assembly is configured to detect the intensities of different regions of an interference pattern produced by the interferometer, and to determine a plurality of output signals on the basis of the intensities of the regions; wherein each of the output signals has a different phase for the relationship between intensity and wavelength.

According to a further aspect, there is provided a method of measuring the wavelength of a test beam. The method comprises providing the test beam into an interferometry assembly according to either of the previous two aspects, and determining the wavelength of the test beam on the basis of the output signal with the greatest rate of change with wavelength at the measured intensity.

BRIEF DESCRIPTION OF THE DRAWINGS

In the figures, where optical components are illustrated:
Double lines indicate mirrors (e.g. 303 in FIG. 3);
Thin dotted lines indicate beam splitters (e.g. 302 in FIG. 3);
Thick dotted or dashed lines indicate beam paths (e.g. 30 in FIG. 3);
Beam paths which do not contribute to the final output are not shown.

INDEX OF TERMS IN EQUATIONS

Unless Otherwise Specified in the Description of the Equation

T—Temperature
P—Optical path length
L—Physical path length
α—Linear coefficient of thermal expansion
n—Refractive index
ψ—Thermo-optic coefficient
q—Thermal path length sensitivity, $q=1/L \, dP/dT=n\alpha+\psi$
ν—Frequency
λ—Wavelength
c—Speed of light in vacuum
S—output power
E—electric field strength
w—Gaussian half-width of a distribution
φ—angle (as indicated in description)
θ—phase difference Subscripts indicate that the quantity is for a particular component or along a particular path, unless otherwise defined. Subscripts n or x indicate a choice of component or path (e.g. $n_x$ would be the refractive index of any of the materials being discussed). Δ is used to indicate a difference, e.g. ΔP is the optical path difference.

DETAILED DESCRIPTION

Temperature Independent Interferometer

In order to create a temperature independent optical locker, a temperature independent interferometer is required. As has been shown above, this is not possible for an etalon. However, this can be achieved for other types of interferometers.

Figure 1A:
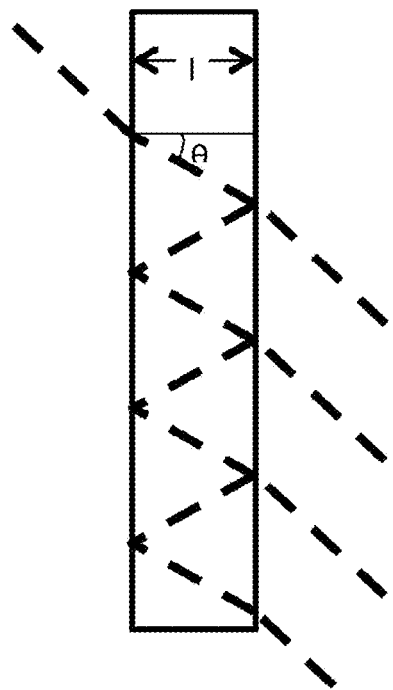
FIG. 1A shows a Fabry-Perot etalon.
Figure 1B:
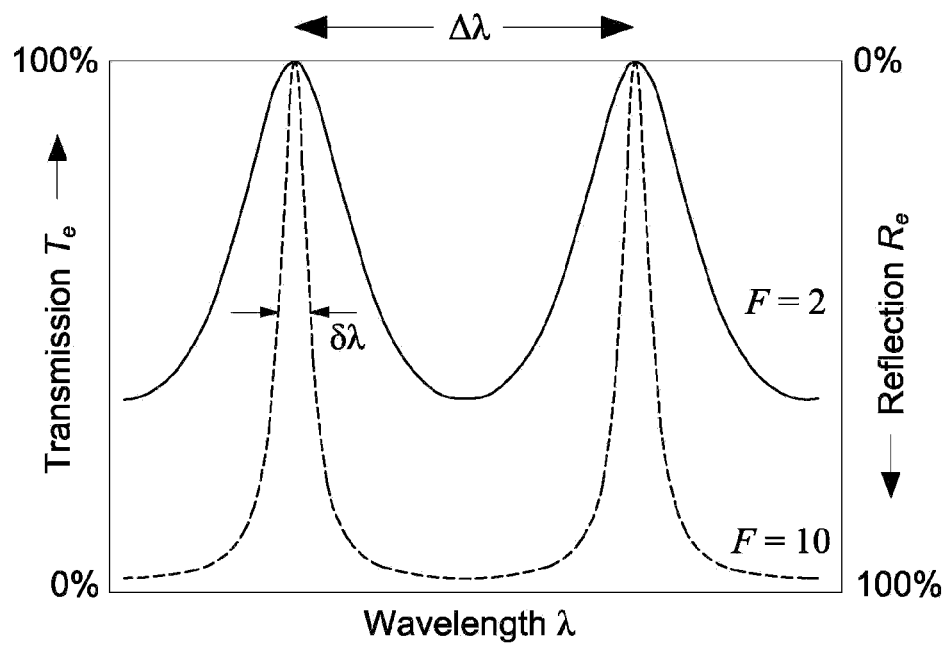
FIG. 1B is a graph illustrating the frequency response of a Fabry-Perot etalon.
Figure 2:
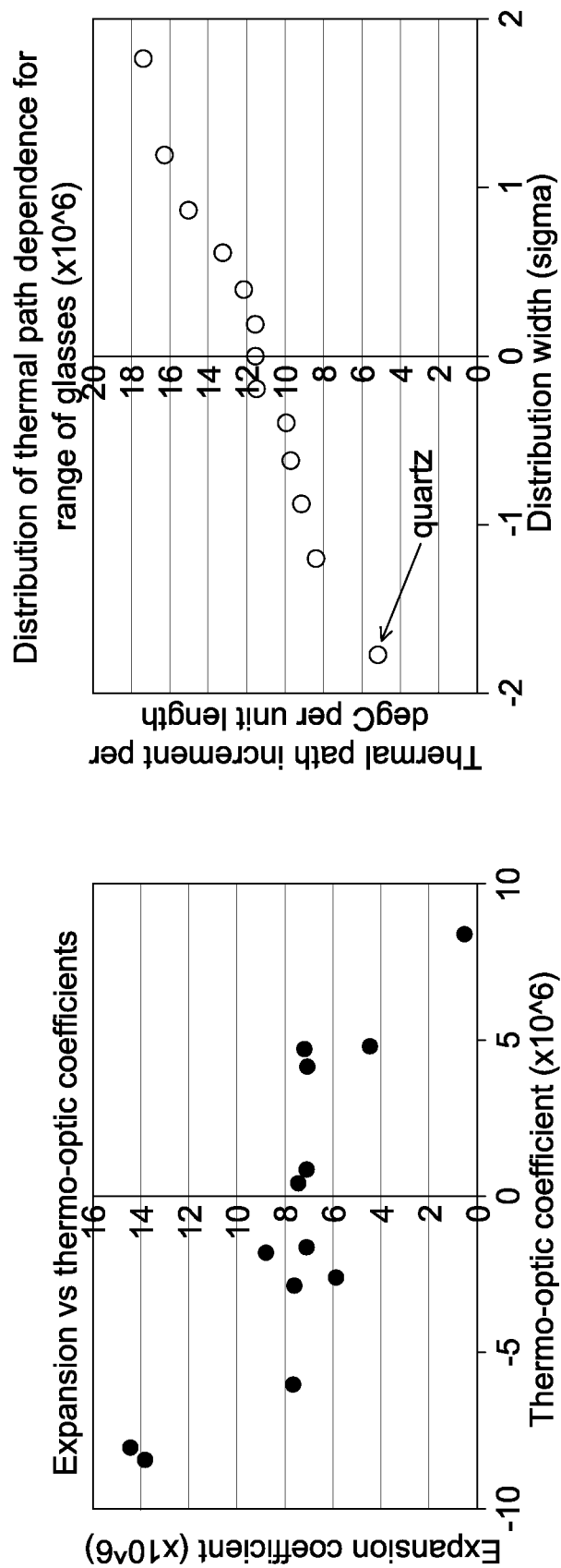
FIG. 2 shows thermal properties of a range of glasses.
Figure 3:
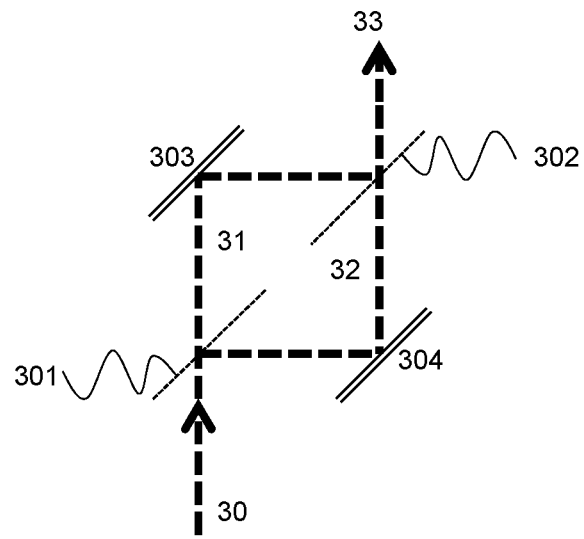
FIG. 3 shows a Mach-Zehnder interferometer according to the prior art.

Consider, for example, a Mach-Zehnder (M-Z) interferometer as shown in FIG. 3. An input beam 30 is split by a beam splitter 301 into intermediate beams 31 and 32. Intermediate beam 31 travels to beam splitter 302 via mirror 303, while intermediate beam 32 is diverted by beam splitter 301 and directed to beam splitter 302 using mirror 304. At beam splitter 302, the beams 31 and 32 recombine into output beam 33, and the intensity of the output is dependent upon the phase difference of intermediate beams 31 and 32 at beam splitter 302, and therefore on the optical path difference between the paths taken by intermediate beams 31 and 32.

Let the path taken by beam 31 have path length $P_{31}$, and let the path taken by beam 32 have path length $P_{32}$.

$$\Delta P = P_{32} - P_{31}$$

$$\frac{d\Delta P}{T} = \frac{dP_{32}}{dT} - \frac{dP_{31}}{dT}$$

therefore $$\frac{d\Delta P}{T} = 0$$

if $$\frac{dP_{32}}{dT} - \frac{dP_{31}}{dT} = 0$$

Since $P_{32}$ and $P_{31}$ are independent (unlike in the FP etalon, where $p_2$ is a multiple of $p_1$), this condition is possible to achieve in practice.

Figure 4:
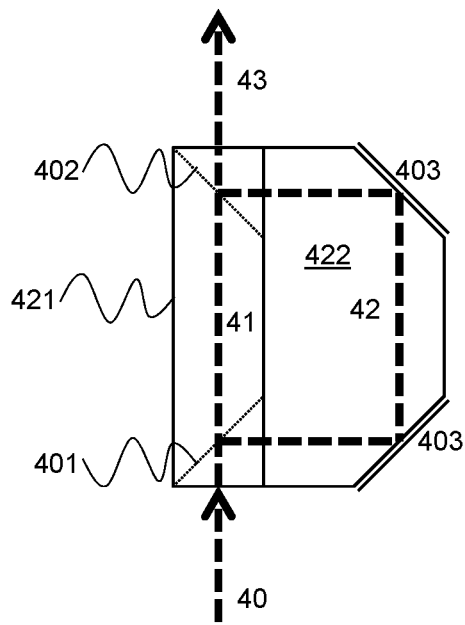
FIG. 4 shows a Mach-Zehnder interferometer according to an embodiment.

For example, consider the M-Z interferometer shown in FIG. 4. An input beam 40 is split by a beam splitter 401 into intermediate beams 41 and 42. Intermediate beam 41 travels directly to beam splitter 402, while intermediate beam 42 is diverted by beam splitter 301 and directed to beam splitter 402 using mirrors 403. At beam splitter 402, the beams 41 and 42 recombine into output beam 43, and the intensity of the output is dependent upon the phase difference of intermediate beams 41 and 42 at beam splitter 402, and therefore on the optical path difference between the paths taken by intermediate beams 41 and 42. The interferometer of FIG. 4 has a part 421 made of a first material, and a part 422 made of a second material. The path taken by beam 41 passes only though the first material; and the path taken by beam 42 passes through both the first and second material.

Figure 5:
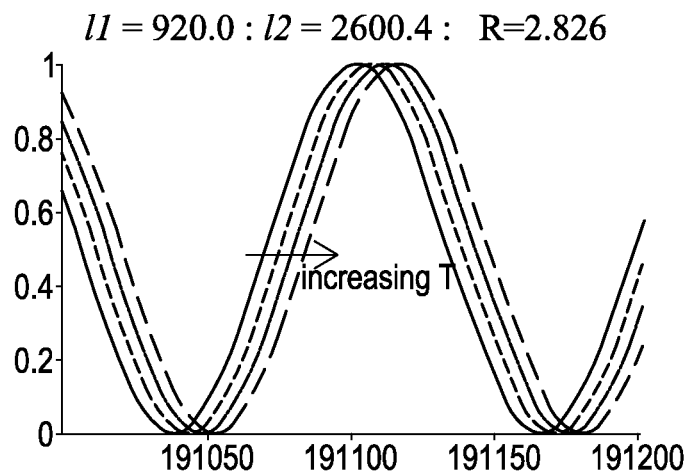
FIG. 5 shows graphs of intensity v wavelength for a selection of interferometers.
Figure 5:
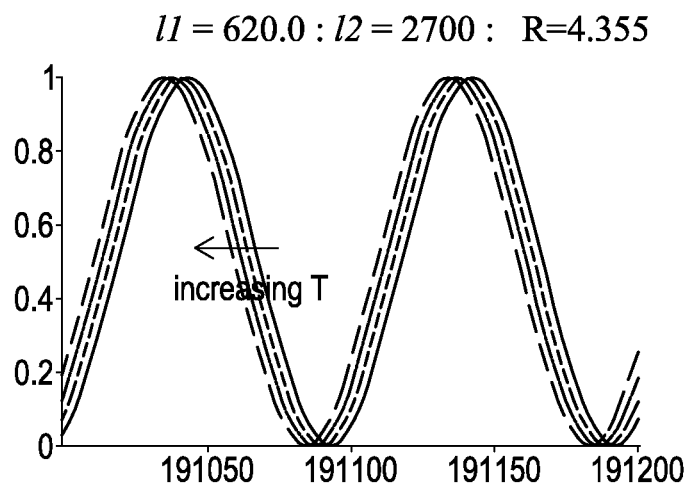
Figure 5:
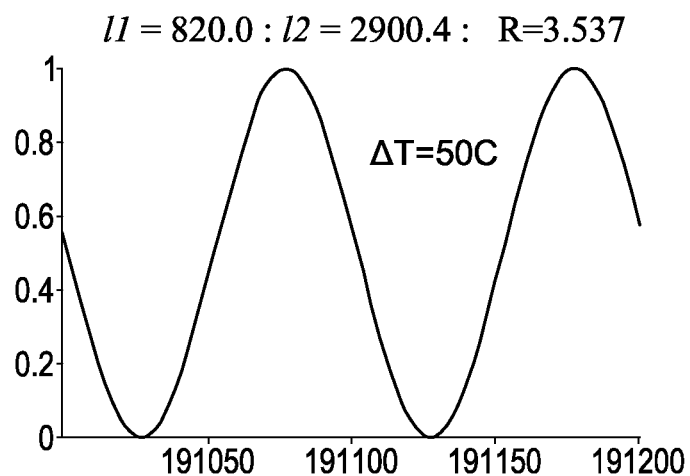

If the first and second materials are properly selected, then adjusting the length of the path taken by beam 42 through each of the first and second material relative to the length of the path taken by beam 41 through the first material can give a geometry where the path difference is thermally independent. For example, where block 421 is made from LAF9 (a commercially available glass) and block 422 is made from quartz, FIG. 5 shows graphs of the intensity of the output vs wavelength for differing ratios of physical path length. The physical path length in FIG. 5 is measured from beam splitter 401 to beam splitter 402, subtracting the distance travelled by beam 32 through block 421 to discount equivalent parts of the paths.

In FIG. 5A, the ratio is 2.826, and the output intensity vs wavelength graph moves to the left with increasing temperature (i.e. the graph is translated in the direction of lower wavelength). In FIG. 5B, the ratio is 4.355, and the graph moves to the right with increasing temperature. FIG. 5C shows the case where the ratio is 3.537—and there is no change to the graph over a temperature difference of 50K—i.e. the interferometer is temperature independent.

Figure 6:
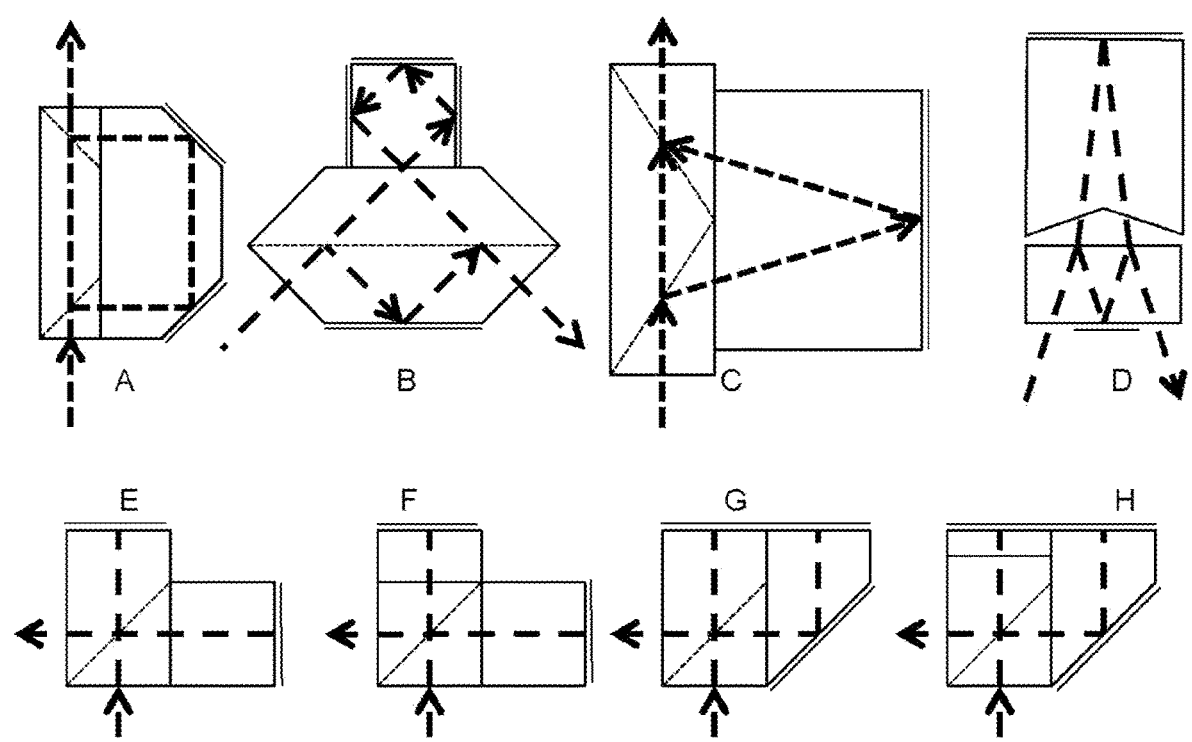
FIG. 6 shows example geometries of interferometers.

It will be appreciated that various geometries are possible which result in temperature independence, provided that the first and second path are independent—i.e. there is at least a part of the first path which does not overlap the second path, and vice versa. Some example geometries based on the M-Z or Michelson interferometer are shown in FIG. 6. Double lines represent reflective surfaces, dotted lines represent beam splitters, and thick dashed lines represent the path taken by the light (neglecting any beams which do not contribute to the interference pattern). Each enclosed region is made from a different material. The non-overlapping parts of the path can be tuned to give the desired temperature independence, which will require that the non-overlapping parts of at least one of the paths pass through two different materials. As shown in FIG. 6D, the beam splitter can be produced by providing an air gap between the two glasses, with either a wedge or cylindrical surface on the side of the air gap opposite the input. The partial internal reflection on the input side of the air gap provides the required beam splitting. The wedge or cylindrical surface ensures that the angle of the beam on the far side of the air gap is different to the angle of the beam on the near side of the air gap, creating the required path difference.

In order to achieve a required free spectral range, as well as thermal independence, the physical path lengths must satisfy:

$$L_1 - L_2 = \frac{c}{\Delta v}$$

$$\sum_x L_{1x} q_x = \sum_x L_{2x} q_x$$

Where $L_1$ is the physical length of non-overlapping portion of the first optical path (i.e. the path between beam splitters); $L_2$ is the physical length of non-overlapping portion of the second optical path; $q_x$ is the thermal path length sensitivity for material x, $q = n\alpha + \psi$; $\Delta v$ is the free spectral range; c is the speed of light in vacuum; and $L_{nx}$ is the physical length of path n passing through material x.

For the interferometer shown in FIG. 4, or for other interferometers where the path $L_1$ passes through only the first material, and path $L_2$ passes a distance $L_0$ through the first material, and a distance $L_2 - L_0$ through the second material, the equations reduce to those below.

$$L_1 - L_0 = \frac{c}{\Delta v} \frac{1}{q_1/q_2 - 1}$$

$$L_2 - L_0 = (L_1 - L_0) \frac{q_1}{q_2}$$

Where $q_1$ is the thermal path length sensitivity of the first material, and $q_2$ is the thermal path length sensitivity of the second material and $q = n\alpha + \psi$. Where both $L_1$ and $L_2$ pass a distance $L_0$ through the first material, and each then passes through respective other materials (e.g. FIG. 6X), these equations can be used with $q_n$ being the thermal path length sensitivity for the other material passed through by path $L_n$. Of course, where there is some freedom in the free spectral range, the distance $L_1$ can be chosen, and the free spectral range calculated from that.

Figure 7:
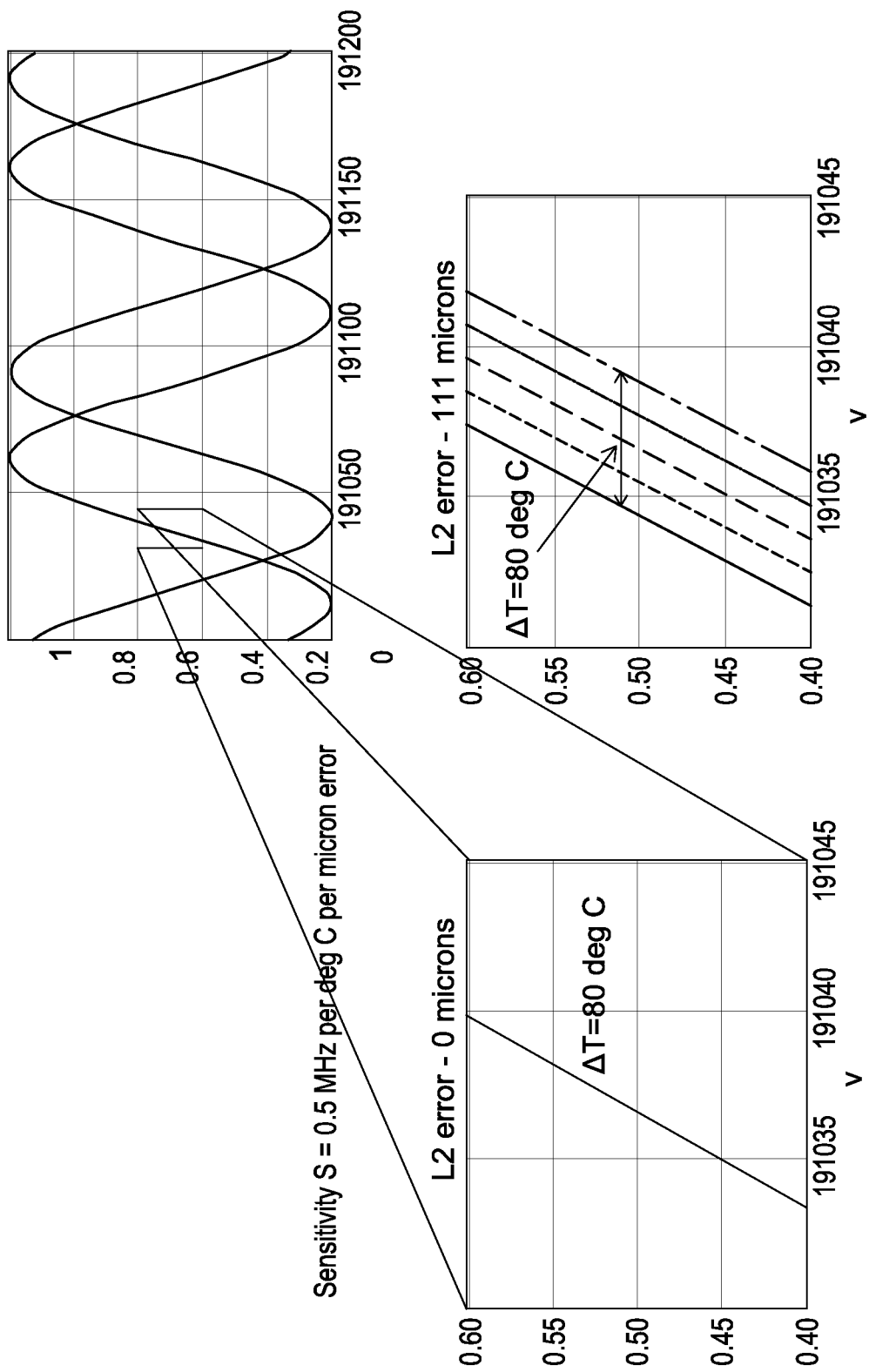
FIG. 7 shows graphs comparing an interferometer at exact thermal independence with an interferometer where $L_2$ is 111 microns too long.

While the refractive index, n, is temperature dependent, q can be assumed constant since the variation in n is small ($\psi$ is typically on the order of $10^{-6}$ to $10^{-7}$, n is typically between 1 and 2, so for temperature differences of around 100K, the variation is up to about 0.1%). The errors introduced by this approximation are likely to be negligible—typical values for L1 and L2 are on the order of 1000 microns, so the error due to any variation in q is likely to be similar to manufacturing tolerances. FIG. 7 shows graphs comparing an interferometer at exact thermal independence with an interferometer where $L_2$ is 111 microns too long—the temperature dependence is 0.5 MHz per K per micron of error. Given that the optical locker will typically be operating at frequencies in the tens of GHz, this is an acceptable variation.

Multiple Output Signals

For the optical locker to function effectively, the wavelength measurement should be made at a region of high gradient of the wavelength/intensity graph. Examples are presented below of ways to achieve such sensitivity over the whole wavelength range with a single interferometer, even where the interferometer is temperature independent. It will be appreciated by the skilled person that the below examples do not require the interferometer to be temperature independent, and will work with temperature dependent interferometers provided that the temperature is adequately controlled.

Figure 8:
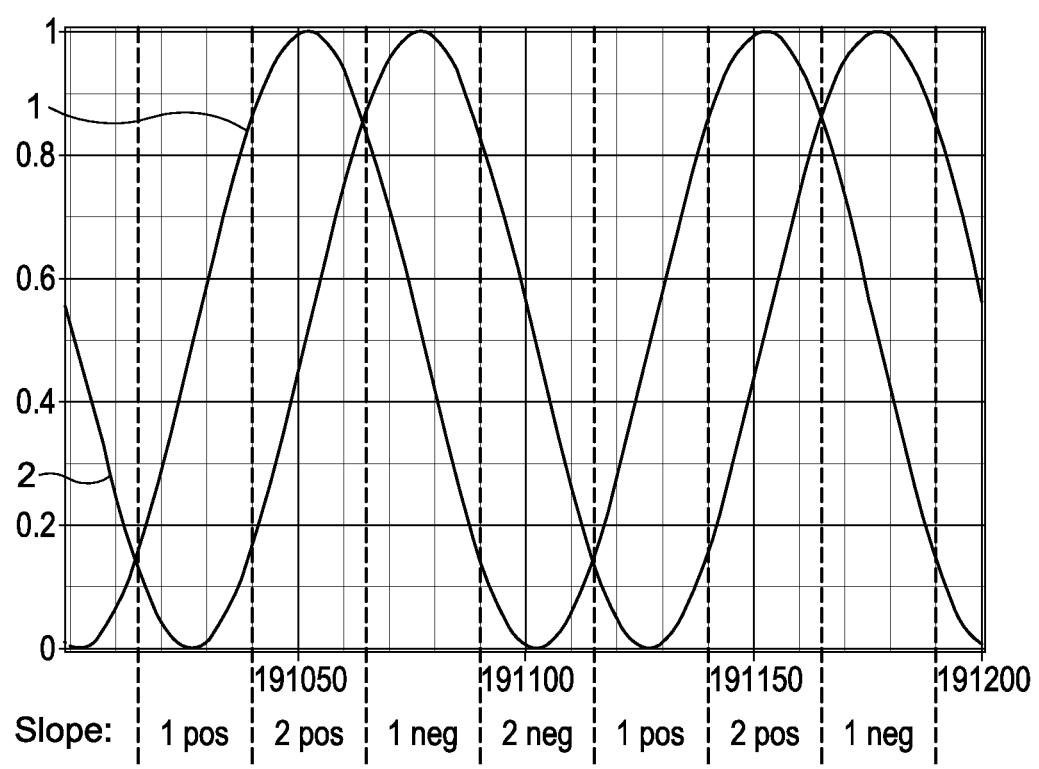
FIG. 8 shows an exemplary output from an interferometer with multiple output signals.

The principle of the below examples is to provide an interferometer with two or more output signals, where at least one of the output signals has a high gradient at any wavelength. An example of this is shown in FIG. 8 in which lines 1, 2 show first and second output signals, respectively. As shown below the graph, by varying which signal is measured depending on the wavelength, a high degree of sensitivity can be maintained over the whole range.

A first option to generate multiple output signals is to use multiple input beams—the input beams are separated either vertically or horizontally, to cause corresponding separation in output beams and allow the signal from each output beam to be resolved separately. In order to cause the difference in output beams, each of the input beams may have different angles of entry into the interferometer, thereby causing a different optical path difference for each beam. To generate the input beams to the interferometer, the beam to be tested may be split by one or more beam splitters prior to entering the interferometer.

For interferometers with a sinusoidal response, such as a Michelson or Mach-Zehnder interferometer, an output of two beams, with a $\pi/2$ phase difference between the wavelength/intensity graphs of each beam gives sufficient sensitivity. For other interferometers, more than two output beams (and hence more than two input beams) may be necessary to cover all wavelengths with sufficient sensitivity. This technique can work for any interferometer where the output signals arrive at the detector assembly physically separated.

Figure 9A:
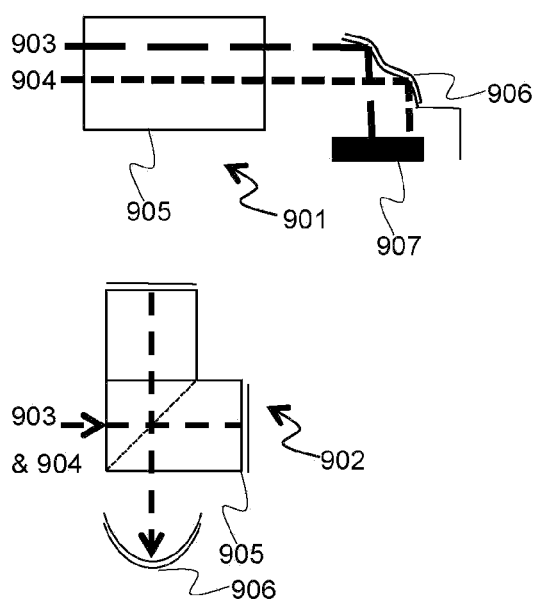
FIG. 9A and FIG. 9B show arrangements for focusing beams onto a detector.
Figure 9B:
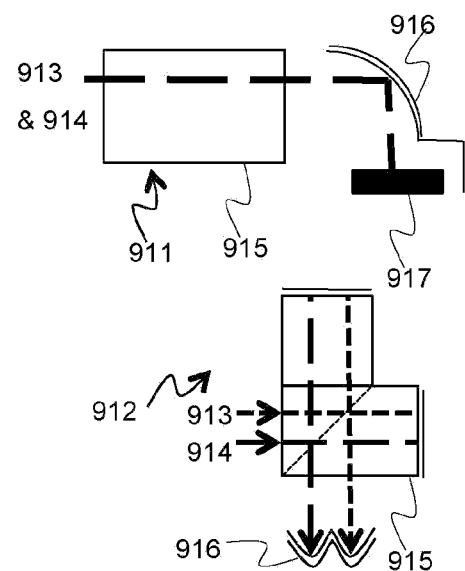

The physical separation can be increased by separating the input beams horizontally and/or vertically. FIG. 9A shows an exemplary interferometer with vertically stacked beams in side view 901 and plan view 902, and FIG. 9B shows an exemplary interferometer with horizontally stacked beams is side view 911 and plan view 912. Each exemplary interferometer has a pair of input beams 903 & 904, 913 & 914, which are directed into an interferometer 905, 915 (shown as a Michelson interferometer, though other types may be used). Each of the beams is directed into the interferometer such that the path difference of each beam is different, e.g. by introducing a small angular error to each beam. The input beams 903 & 904, 913 & 914 produce respective output beams, which are focused by parabolic mirror assembly 906, 916 onto detector assembly 907, 917. Detector assembly 907, 917 is not shown in the plan view, as it is underneath parabolic mirror assembly 906, 916. Parabolic mirror assembly 906, 916 comprises two parabolic mirrors, one for each beam, and detector assembly 907, 917 comprises a detector or detector region for each beam, and produces a separate output signal for each beam.

Figure 10:
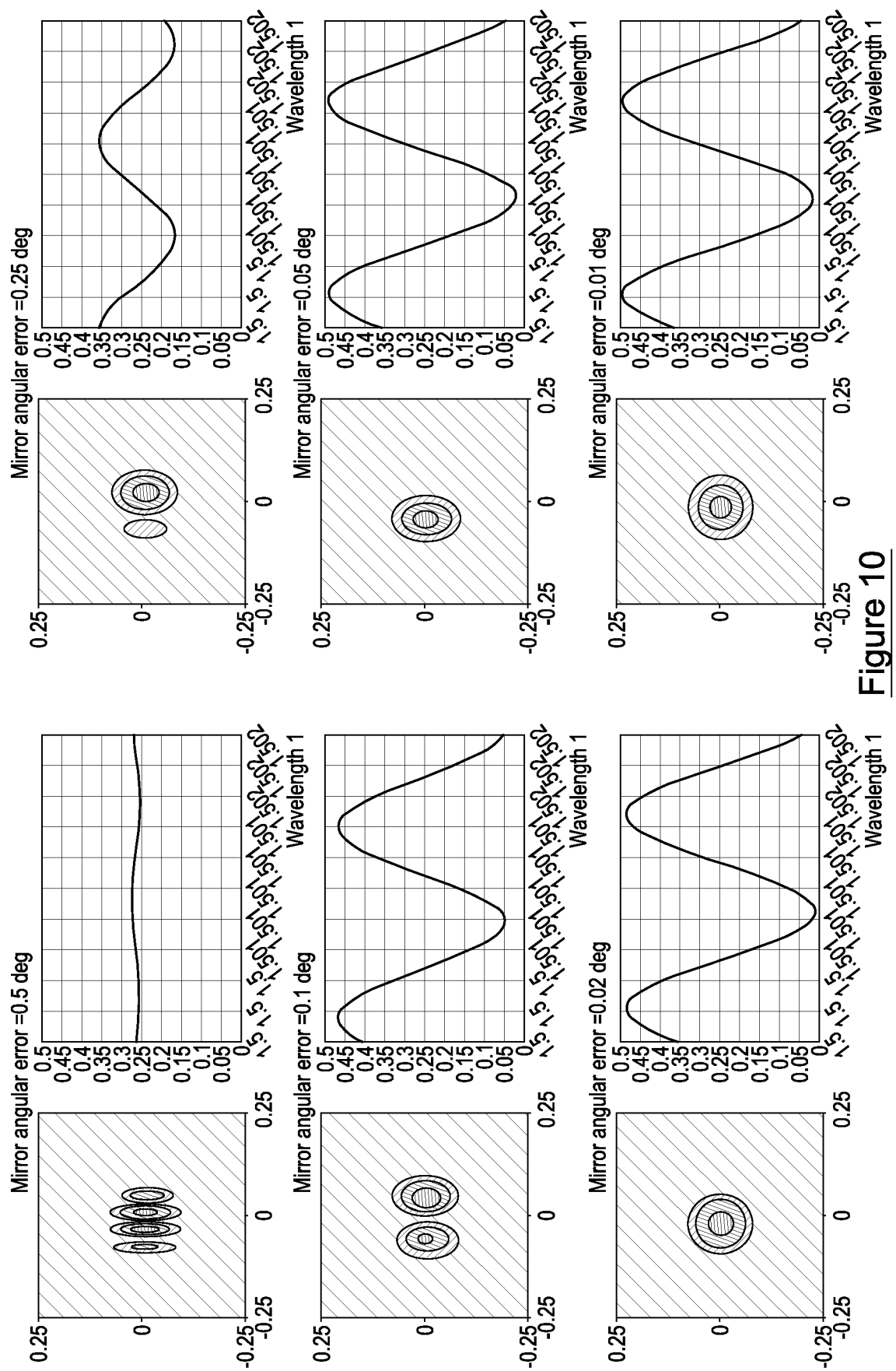
FIG. 10 shows interference patterns for a range of interferometers.

Alternatively, a single input beam may be used to obtain two output signals. This can be done by introducing a small angular error into the mirrors of a Michelson or Mach-Zehnder interferometer. As can be seen in FIG. 10, instead of forming concentric circles, the interference pattern tends towards a series of parallel fringes as the angular error increases. The change in intensity of the pattern with wavelength is less pronounced, but the pattern instead translates to either side with changes in wavelength. The condition for the pattern to behave in this way is that, when viewed from the output of the interferometer, the image of the input along one beam path is displaced in a direction perpendicular to the beam path from an image of the input along the other beam path. Where the images of the input are displaced entirely parallel to the beam path, the "classic" concentric circle fringe pattern appears, and its intensity depends on the wavelength. Where the images of the input are displaced entirely perpendicular to the beam path, the interference pattern is a series of fringes and the intensity is independent of the wavelength. Other displacements will form the intermediate patterns shown in FIG. 10, depending on the angle between the beam path and a line connecting the images of the input.

Figure 11A:
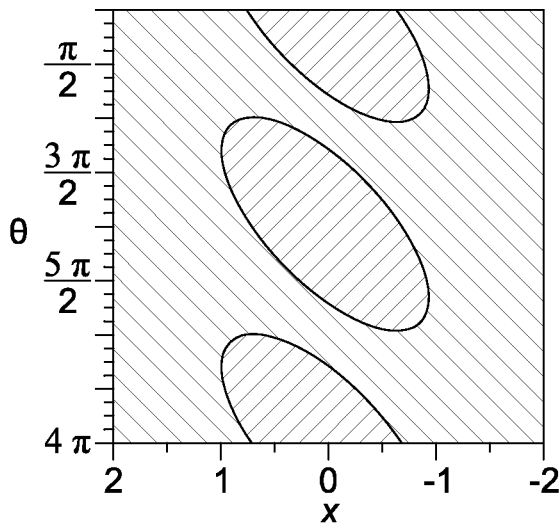
FIG. 11A and FIG. 11B show intensity along a slice of a detector vs phase angle for an exemplary interferometer.
Figure 11B:
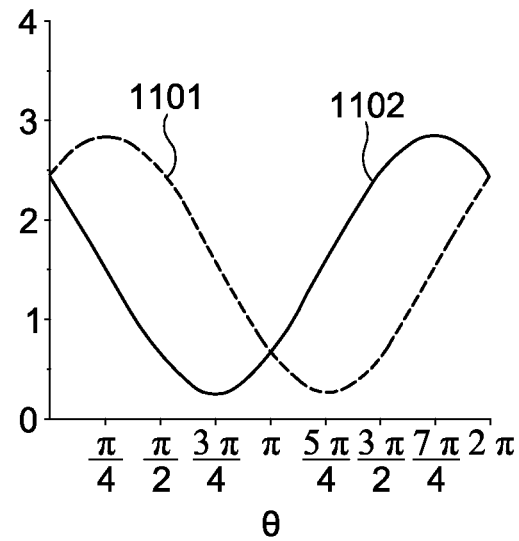

FIG. 11A shows the horizontal (x) distribution of intensity across the centre of the detector as the phase difference (θ) between the two arms is varied. The spot can be seen to displace along the x-axis and be replaced by another spot as the phase difference changes. This happens periodically with a period equal to the FSR. FIG. 11B shows the integrated intensity detected by each half of the detector (i.e. x>0, x<0)—this generates two signals 1101, 1102 with a π/2 phase difference as desired (and as discussed in connection with FIG. 8).

Figure 12A:
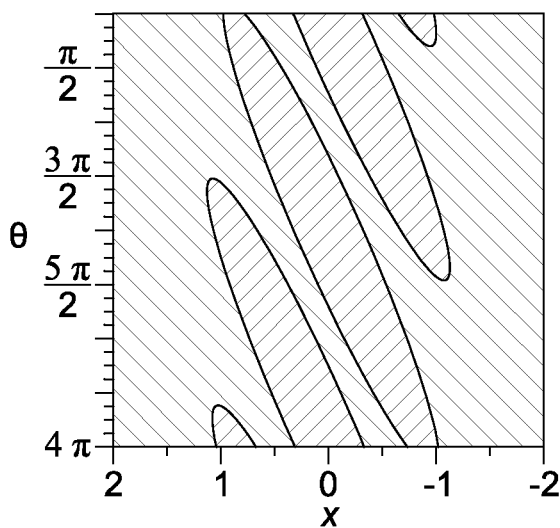
FIG. 12A and FIG. 12B show intensity along a slice of a detector vs phase angle for a further exemplary interferometer.
Figure 12B:
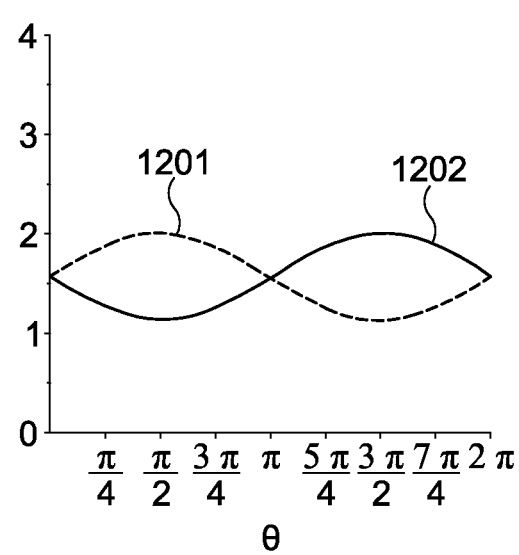

If the angle between the beams is increased, then fringe spacing decreases (as described above with reference to FIG. 10), and several intensity peaks move across the image. This is shown in FIG. 12A, which shows the horizontal (x) distribution of intensity across the centre of the detector as the phase difference (θ) between the two arms is varied for an interferometer with a greater angle between the beams than in FIG. 11A. FIG. 12B shows the integrated intensity gathered for each half of the detector—it can be seen that this example would not be suitable for a multiple output system, as the two signals 1201, 1202 are in antiphase, so the largest gradient of each signal occurs together. It will be appreciated by the skilled person that the angle between the beams and the configuration of the regions of the detector can be varied to produce any number of signals with a desired phase difference.

Figure 13:
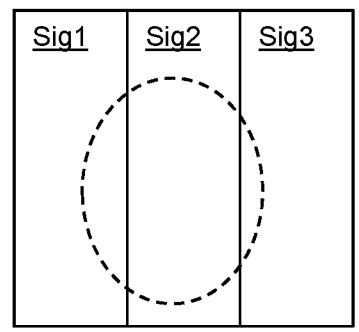
FIG. 13 shows an exemplary detector.

Therefore, the intensity in different regions of the pattern will still vary with wavelength. Measuring separate regions of the pattern can therefore give signals which vary with wavelength at a constant phase difference from each other. For example, dividing the detector into three sections as shown in FIG. 13, and taking the two signals as sig1/sig2 and sig3/sig2 will give plots with a phase displacement dependent on the width of detector 2.

Alternatively, the detector may be divided into two sections, and the output signals obtained from each section.

In general, to retrieve a number of output signals, the detector may be divided into that number of segments, with one signal retrieved from each segment, or into a greater number of segments, with signals obtained by combinations of segments.

The phase difference between signals can be calculated from the power received at each detector.

$$E_{tot} = \left( e^{-\frac{x}{w_-x^2} - \frac{y}{w_y^2}} e^{-ix\varphi_0} + e^{-\frac{x}{w_-x^2} - \frac{y}{w_y^2}} e^{i(x\varphi_0 + \theta)} \right) E_0$$

$$S_{tot} = E_{tot}\overline{E_{tot}} = ((\cos(x\varphi_0 + \theta) + \cos(x\varphi_0))^2 + (\sin(x\varphi_0 + \theta) - \sin(x\varphi_0))^2)$$

$$\left( e^{-\frac{x}{w_-x^2} - \frac{y}{w_y^2}} \right)^2 E_0^2$$

$$sigN = \int_{-\infty}^{\infty} \int_{n_-w_x}^{n_+w_x} S_{tot} dx dy$$

where $w_x$ and $w_y$ are the Gaussian half widths of the beam in x and y respectively, $\varphi_0$ is the directional angular separation between the two beams, θ is the phase difference between the two beams and depends on the frequency, $E_{tot}$ is the total electrical field from the output, $S_{tot}$ is the total output power, $E_0$ is a constant, sigN is the signal received from region N, and $n_+$ and $n_-$ are the extent of the region N in the x direction, measured in units of $w_x$. The above equation gives an idealised case where the extent of the detectors in the y direction is infinite. In a practical application where the detector extends to $\pm Yw_y$, the final integral is:

$$sigN = \int_{-Yw_y}^{Yw_y} \int_{n_-w_x}^{n_+w_x} S_{tot} dx dy$$

In order to produce an output which can be used in an optical locker, the output signal must be normalised, so that the signal is dependent only on the wavelength and not on the power of the input beam. In a conventional optical locker, this is performed by splitting the beam prior to the etalon, sending a first beam to the interferometer, and a second beam to a detector. The output signal from the etalon is divided by the signal from the detector to form a normalised output signal. However, this requires that a portion of the power is "siphoned off" to the detector, and so reduces the efficiency of the optical locker.

Figure 14:
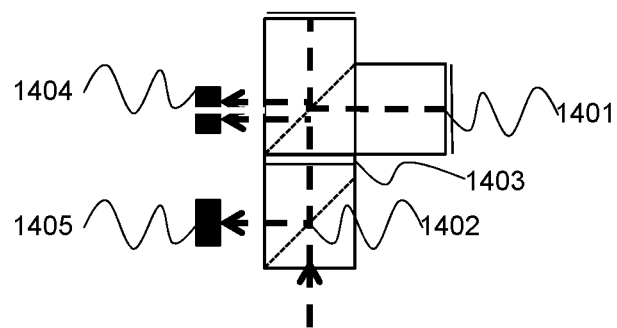
FIG. 14 shows an exemplary interferometer.

When using a Michelson interferometer, a more efficient normalisation can be obtained, whist also preventing the return of light to the laser. An exemplary system is shown in FIG. 14. The Michelson interferometer 1401 may be temperature independent (as shown in the Figure, and described above) or it may be a conventional Michelson interferometer. In addition, this may be used with the angular error in the mirrors described above. The input beam is provided polarised with an input polarisation, which is a linear polarisation. The beam splitter 1402 is a 100% polarising splitter configured to allow the input polarisation to pass through. The reflected component of the input beam (not shown) is absorbed by an absorbing surface, and the transmitted component passes to the interferometer 1401 via a quarter wave plate 1403, meaning that the light within the interferometer is circularly polarised. The interferometer creates two output beams—one passing to the detector 1404, and another passing back along the path of the input beam. As the second output beam passes the quarter wave plate, it is linearly polarised such that when it meets the 100% polarising splitter, the beam is totally reflected to the detector 1405.

The input power to the interferometer is the sum of the power at the detectors 1404 and 1405, so the normalisation can be calculated as $S_{1204}/(S_{1204}+S_{1205})$, where S is the power measured at each detector. If the detectors 1404 and 1405 do not have the same sensitivity, then the normalised signals will have a slightly non-sinusoidal relationship between intensity and wavelength. This is not significant for ~10% differences in sensitivity between the detectors, and can be corrected for at greater differences. Similarly, the signal profile will be altered due to any dead space between segments of a multi-part detector, but these errors can be compensated for as the effect is identical over the band.

The invention claimed is:
1. An interferometry assembly, the interferometry assembly comprising:
   an interferometer configured to receive an input beam,
      the interferometer including a first part made of a first solid material and a second part made of a second solid material that is different than the first solid material,
      the interferometer including a first beam splitter that splits the input beam into a first intermediate beam that has a first path through only the first solid material and a second intermediate beam that has a second path through only the first solid material and the second solid material, wherein the first path and the second path begin at the first beam splitter, wherein the first path, the second path, the first intermediate beam, and the second intermediate beam end at a second splitter, and wherein the interferometer is configured to recombine, via the second splitter, the first intermediate beam and the second intermediate beam to produce an output beam.

2. The interferometry assembly of claim 1, wherein the first path and the second path are of different lengths and create a phase difference between the first intermediate beam and the second intermediate beam when recombined.

3. The interferometry assembly of claim 1, wherein a first thermal path length sensitivity property of the first solid material and a second thermal path length sensitivity property of the second solid material provide temperature independence for a phase difference between the first intermediate beam and the second intermediate beam.

4. The interferometry assembly of claim 1, wherein the first solid material comprises a glass, and the second solid material comprises quartz.

5. The interferometry assembly of claim 1, wherein at least a portion of the first path does not overlap with the second path.

6. The interferometry assembly of claim 1, wherein the interferometer is a Mach-Zehnder interferometer.

7. The interferometry assembly of claim 1, wherein the interferometer is a Michelson interferometer.

8. The interferometry assembly of claim 1, wherein the first beam splitter comprises an air gap.

9. A method, comprising:
receiving, by an interferometer, an input beam,
the interferometer including a first part made of a first solid material and a second part made of a second solid material that is different than the first solid material,
the interferometer including a first beam splitter that splits the input beam into a first intermediate beam that has a first path through only the first solid material and a second intermediate beam that has a second path through only the first solid material and the second solid material,
wherein the first path and the second path begin at the first beam splitter,
wherein the first path, the second path, the first intermediate beam, and the second intermediate beam end at a second splitter, and
wherein the interferometer is configured to recombine, via the second splitter, the first intermediate beam and the second intermediate beam to produce an output beam; and
producing, by the interferometer, the output beam.

10. The method of claim 9, further comprising:
producing, by a detector assembly, an output signal that is dependent on an intensity of the output beam.

11. The method of claim 9, wherein the first path and the second path are of different lengths and create a phase difference between the first intermediate beam and the second intermediate beam when recombined.

12. The method of claim 9, wherein a first thermal path length sensitivity property of the first solid material and a second thermal path length sensitivity property of the second solid material provide temperature independence for a phase difference between the first intermediate beam and the second intermediate beam.

13. The method of claim 9, wherein the first solid material comprises a glass, and the second solid material comprises quartz.

14. The method of claim 9, wherein at least a portion of the first path does not overlap with the second path.

15. The method of claim 9, wherein the interferometer is a Mach-Zehnder interferometer.

16. The method of claim 9, wherein the interferometer is a Michelson interferometer.

17. The method of claim 9, wherein the first beam splitter comprises an air gap.

18. An interferometer configured to receive an input beam, the interferometer comprising:
a first part made of a first solid material and a second part made of a second solid material that is different than the first solid material; and
a first beam splitter that splits the input beam into a first intermediate beam that has a first path through only the first solid material and a second intermediate beam that has a second path through only the first solid material and the second solid material,
wherein the first path and the second path begin at the first beam splitter,
wherein the first path, the second path, the first intermediate beam, and the second intermediate beam end at a second beam splitter, and
wherein the interferometer is configured to recombine, via the second beam splitter, the first intermediate beam and the second intermediate beam to produce an output beam.

19. The interferometer of claim 18, wherein a first thermal path length sensitivity property of the first solid material and a second thermal path length sensitivity property of the second solid material provide temperature independence for a phase difference between the first intermediate beam and the second intermediate beam.

20. The interferometer of claim 18, wherein the first solid material comprises a glass, and the second solid material comprises quartz.

* * * * *